United States Patent [19]

Wessely

[11] Patent Number: 4,521,829
[45] Date of Patent: Jun. 4, 1985

[54] DEVICE FOR COOLING A PLURALITY OF INTEGRATED MODULES COMBINED ON A RIGID PRINTED CIRCUITBOARD TO FORM LOGIC CARDS

[75] Inventor: Herrmann Wessely, Munich, Fed. Rep. of Germany

[73] Assignee: Siemens Aktiengesellschaft, Berlin and Munich, Fed. Rep. of Germany

[21] Appl. No.: 526,372

[22] Filed: Aug. 25, 1983

[30] Foreign Application Priority Data

Sep. 9, 1982 [DE] Fed. Rep. of Germany ....... 3233491

[51] Int. Cl.³ .............................................. H05K 7/20
[52] U.S. Cl. ..................................... 361/387; 361/386
[58] Field of Search ...................... 165/80 B, 80 C, 46, 165/185; 174/52 FP, 16 HS; 357/81, 79; 361/385–388, 405, 415

[56] References Cited

U.S. PATENT DOCUMENTS

| 3,896,544 | 7/1975 | Fosnough | 357/79 |
| 3,993,123 | 11/1976 | Chu et al. | 165/80 |
| 4,180,828 | 12/1979 | Schermer et al. | 357/79 |
| 4,358,785 | 11/1982 | Takigami et al. | 357/79 |

FOREIGN PATENT DOCUMENTS 0001153 3/1979 European Pat. Off. .

OTHER PUBLICATIONS

Doo et al., "IBM Technical Disclosure Bulletin" vol. 21, No. 2, 7/79, pp. 585–586.
Arnold et al., "IBM Technical Disclosure Bulletin" vol. 21, No. 4, 9/79, pp. 1473–1474.
Wanesky, "Western Electric Technical Digest" No. 8, 4/70, pp. 41–42.

Primary Examiner—A. D. Pellinen
Assistant Examiner—Gregory D. Thompson
Attorney, Agent, or Firm—Hill, Van Santen, Steadman & Simpson

[57] ABSTRACT

Integrated modules are disposed on a rigid printed circuitboard with the entire rear surface of each module in contact with a common cooling plate. The individual contact pressure of the integrated modules against the cooling plate occurs by way of resilient elements respectively inserted between the printed circuitboard and the modules.

7 Claims, 3 Drawing Figures

DEVICE FOR COOLING A PLURALITY OF INTEGRATED MODULES COMBINED ON A RIGID PRINTED CIRCUITBOARD TO FORM LOGIC CARDS

CROSS REFERENCE TO RELATED APPLICATION

This application is related to an application Ser. No. 526,372, filed 8/25/83.

BACKGROUND OF THE INVENTION

1. Field of the Invention

The present invention relates to a cooling structure, and is more particularly concerned with a device for cooling integrated modules and, in particular, for cooling a plurality of integrated modules combined to form logic cards.

2. Description of the Prior Art

Increasing miniaturization of integrated modules to form very large scale integrated (VLSI) modules and, in conjunction therewith, the high packing density result in a high heat emission of logic cards which are equipped with a plurality of such integrated modules, which can easily lead to a transgression of the temperatures which are permissible for the integrated modules. Such logic cards must therefore be provided with one or more cooling members for thermal protection.

It is known in the art to employ large-surface metal plates as cooling members for such logic cards, the metal plates emitting the waste heat of the integrated modules either to the air surrounding the modules or to hollow bodies traversed by liquid or gas. It is therefore known, for example, from U.S. Pat. No. 3,993,123 to provide a device having a plurality of heat-generating electrical modules which are mounted on a base. A heat dissipation housing seals and surrounds the heat-generating components. The wall of the housing lying opposite the base exhibits elongate, cylindrical openings in the direction toward the heat-generating components. A spring element, which is supported against the inner end of the opening, is located in each such opening of the housing. Further located in each opening is a heat-conductive element in the form of a piston which is dimensioned such that only a narrow gap remains between the outer walls of the openings and the piston. Each spring element presses the heat conduction element against one of the heat-generating components. A thermally conductive, inert fluid is located inside of the housing and fills all gaps and cavities thereof. The heat is dissipated from the housing by way of external dissipation structure. Every individual electronic module is individually cooled by such techniques or by techniques such as known from the European patent application No. 0001 153 as a further development of this general concept. What is disadvantageous, given this type of cooling structure, however, is that the heat from the chip of the integrated module flows only over punctiform contacts into the die and, from there, into the actual cooling member by way of a gas path. The punctiform contact between the integrated module and the metal die and the gas path between the metal die and the cooling member have a relatively high thermal resistance. This structure, moreover, requires a great expense.

SUMMARY OF THE INVENTION

It is therefore the object of the present invention to provide a device for cooling such integrated modules which, on the one hand, exhibits a significantly lower thermal resistance and therefore produces a noticeably better cooling of the integrated modules and, which, moreover, requires significantly lower expense.

The above object is achieved, according to the present invention, in that the integrated modules exhibit no housing; in that they are disposed on a rigid printed circuitboard; in that the entire rear surface of the integrated module is in contact with a cooling plate exhibiting very high planarity shared by all integrated modules; and in that the individual pressure of the individual integrated modules against the shared cooling plate is achieved by way of resilient elements respectively inserted between the rigid printed circuitboard and the integrated module. The thermal resistance of the device can be further reduced by interposing a conductive lubricant between the integrated modules on the one hand and the cooling plate on the other hand.

BRIEF DESCRIPTION OF THE DRAWING

Other objects, features and advantages of the invention, its organization, construction and operation will be best understood from the following detailed description, taken in conjunction with the accompanying drawing, on which.

DESCRIPTION OF THE PREFERRED EMBODIMENTS

Figure 1:
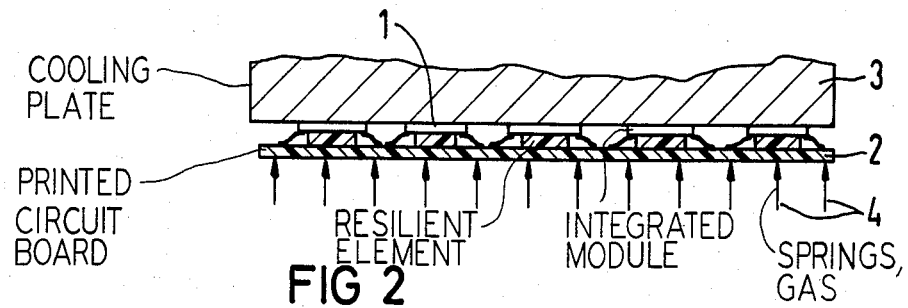
FIG. 1 is a schematic representation, shown in section, of the basic structure of the cooling device constructed in accordance with the present invention.

FIG. 1 illustrates a plurality of integrated modules 1 which are combined into a logic card on a rigid printed circuitboard 2. It can be further seen that the integrated modules 1 are in contact over their entire rear surface with a cooling plate 3 which is shared by all integrated modules. This common cooling plate 3 exhibits a very high planarity. The rigid printed circuitboard 2, together with the integrated modules 1 is pressed with high planarity against the shared cooling plate 3 by way of a planarly effective pressure 4 in the form, for example, of a multitude of springs or of a gaseous agent. An optimum contact pressure of the individual integrated modules 1, however, is not guaranteed with a rigid printed circuitboard 2 alone. In order to achieve optimum contact pressure, the contact pressure for the individual integrated modules 1 is individually distributed in that individual, resilient elements are respectively disposed between the rigid printed circuitboard 2 and the integrated module 1.

Figure 2:
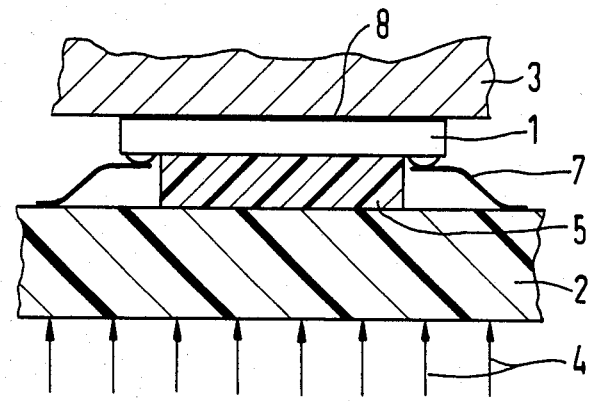
FIG. 2 is an enlarged fragmentary section of the structure of FIG. 1 specifically illustrating a resilient filling device between the integrated module and the rigid printed circuitboard.

FIG. 2 illustrates a possible sample embodiment of such resilient elements, here in the form of a resilient filler piece 5 disposed between the integrated module 1 and the rigid printed circuitboard 2. The resilient filler 5 advantageously comprises rubber and the terminal 7 of the integrated module 1 are designed such that they cannot absorb any forces. The resilient filler pieces 5 cause the force 4 planarly exerted on the rigid printed circuitboard to be individually supplied to each individual integrated module and, therefore, reliably presses each integrated module against the common cooling plate 3.

Figure 3:
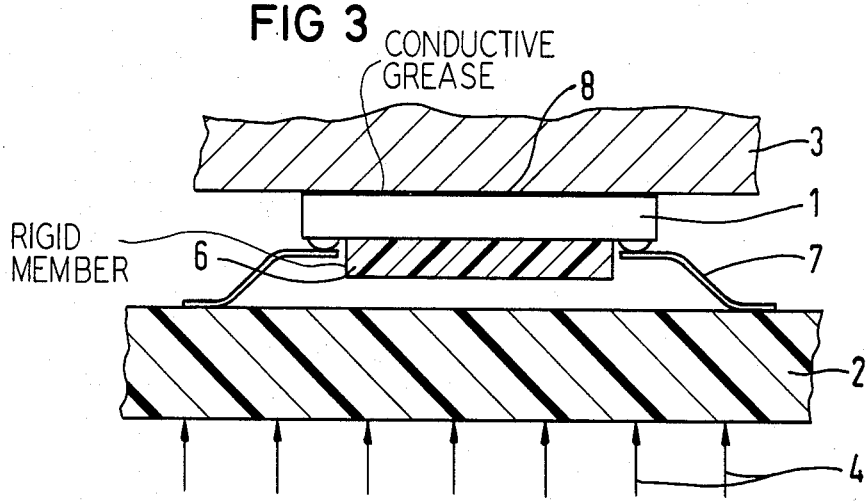
FIG. 3 is a fragmentary view, similar to that of FIG. 2 specifically illustrating the disposition of a rigid spacer between the integrated module and the rigid printed circuitboard.

Another exemplary embodiment of the invention is illustrated in FIG. 3. This embodiment differs from the exemplary embodiment of FIG. 2 in that the terminal 7 are designed such that they function as spring elements, given contact pressure of the rigid printed circuitboard 2 against the cooling plate 3. A rigid spacer 6, in addition, is provided between each integrated module 1 and the rigid printed circuitboard 2, the spacer 6 serving to limit the spring path.

In order to further reduce the thermal resistance of the device of the present invention, which is already very low, it is advantageous to respectively introduce a conductive grease 8 between the integrated modules 1 and the common, shared cooling plate 3.

The integrated modules 1 are contacted on the printed circuitboard 2 in accordance with the so-called micropack connection technique.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A device which cools a plurality of integrated modules, comprising:
   a rigid printed circuitboard;
   a plurality of integrated modules carried on said rigid printed circuitboard, each of said modules including a planar rear surface facing away from said printed circuitboard;
   a common cooling plate including a highly-planar surface contacting each of said rear surfaces;
   pressure means acting on said rigid printed circuitboard to press said modules against said cooling plate; and
   a plurality of resilient means individually disposed between said rigid printed circuitboard and said modules to individually press said modules against said cooling plate.

2. The device of claim 1, wherein:
   each of said resilient means comprises a resilient pad.

3. The device of claim 1, wherein:
   each of said resilient means comprises a rubber pad.

4. The device of claim 1, said integrated modules having terminals wherein:
   each of said resilient means comprises a resilient pad contacting the respective module and said printed circuitboard.

5. The device of claim 1, and further comprising:
   conductive grease between said rear surfaces and said cooling plate.

6. A device which cools a plurality of integrated modules, comprising:
   a rigid printed circuitboard;
   a plurality of integrated modules carried on said rigid printed circuitboard, each of said modules including a planar rear surface facing away from said printed circuitboard;
   a common cooling plate including a highly-planar surface contacting each of said rear surfaces;
   pressure means acting on said rigid printed circuitboard to press said modules against said cooling plate; and
   a plurality of resilient means individually disposed between said rigid printed circuitboard and said modules to individually press said modules against said cooling plate, each of said resilient means comprising spring terminals on the modules.

7. The device of claim 6, wherein:
   each of said resilient means further comprises a rigid member to limit the spring path.

* * * * *